United States Patent [19]
Redlich

[11] Patent Number: 5,450,521
[45] Date of Patent: Sep. 12, 1995

[54] PULSE WIDTH MODULATOR

[75] Inventor: Robert W. Redlich, Athens, Ohio

[73] Assignee: Sunpower, Inc., Athens, Ohio

[21] Appl. No.: 285,117

[22] Filed: Aug. 3, 1994

[51] Int. Cl.⁶ .............................................. H02P 7/29
[52] U.S. Cl. .................................. 388/829; 388/831; 318/129
[58] Field of Search ............... 388/804, 809, 811, 816, 388/819, 825, 826, 828, 829, 830, 831; 318/599, 687, 119, 129, 135, 811; 363/41

[56] References Cited
U.S. PATENT DOCUMENTS

| | | |
|---|---|---|
| 4,047,083 | 9/1977 | Plunkett . |
| 4,245,290 | 1/1981 | Lipman . |
| 4,295,082 | 10/1981 | Moto et al. . |
| 4,312,030 | 1/1982 | Byers . |
| 4,352,155 | 9/1982 | Gyugyi . |
| 4,626,979 | 12/1986 | JaQuay . |
| 5,053,690 | 10/1991 | Mutoh et al. . |
| 5,156,005 | 10/1992 | Redlich . |

*Primary Examiner*—Bentsu Ro
*Attorney, Agent, or Firm*—Frank H. Foster; Kremblas, Foster and Millard

[57] ABSTRACT

An electrical circuit and method for generating a continuous train of width modulated pulses. A square wave is generated and a delay circuit provides a delayed analog of the square wave. A controllable duration one-shot multivibrator generates a modulating pulse having a duration proportional to the sum of the absolute value of the modulating signal and a constant offset. The constant offset is chosen so that, in the absence of a modulating signal, the offset provides the largest control signal to the one-shot multivibrator which causes an output modulating pulse from the multivibrator equal in duration to the minimum duration which the multivibrator intrinsically is capable of obtaining. The polarity of the modulating signal is detected, a logical OR operation is performed upon the delayed square wave and the modulating pulse and an EXCLUSIVE OR operation is performed upon the combination of the result of the OR operation and the polarity detector output logic level.

10 Claims, 5 Drawing Sheets

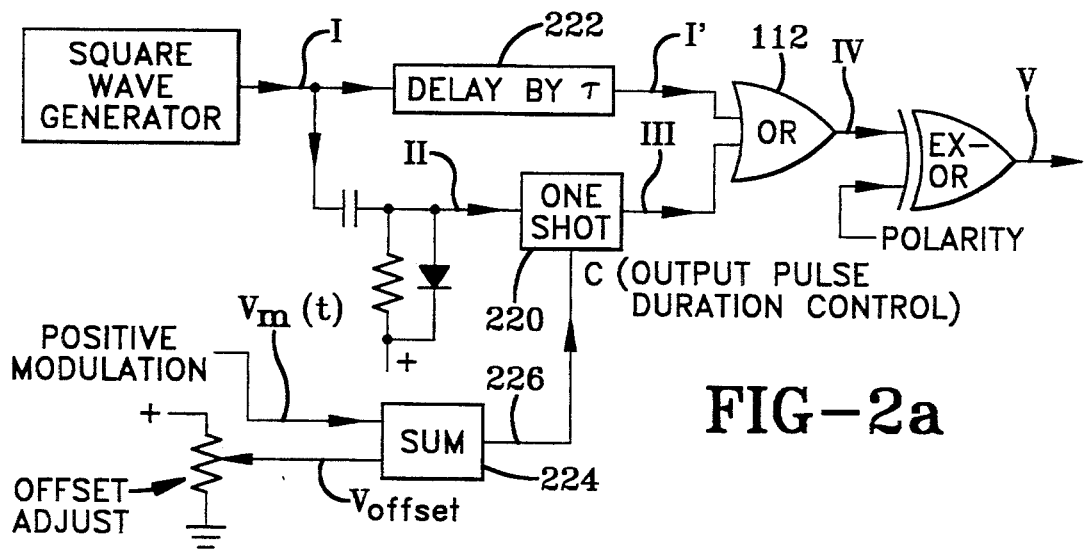
FIG-2a
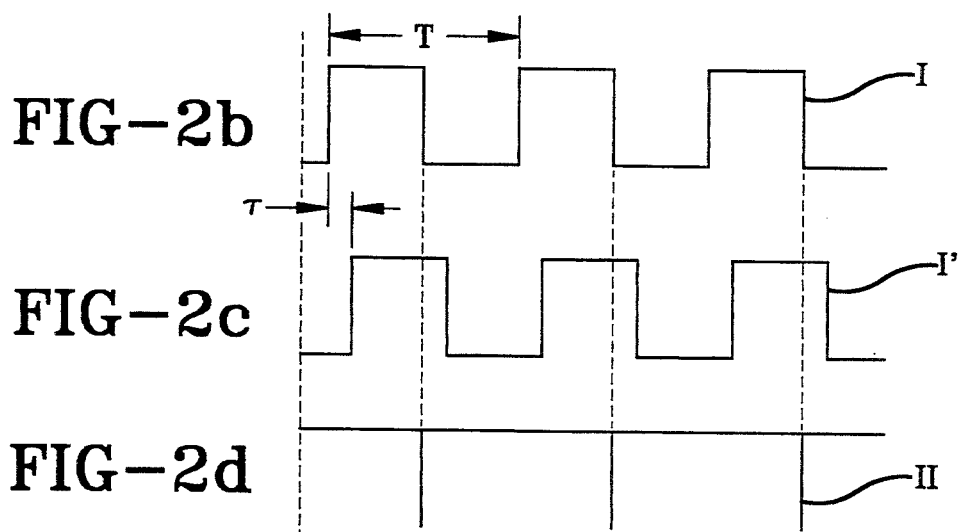
FIG-2b
FIG-2c
FIG-2d
FIG-2e
FIG-2f
FIG-2g
FIG-2h

PULSE WIDTH MODULATOR

TECHNICAL FIELD

This invention relates generally to electronic circuitry, and more particularly to a pulse width modulator which is particularly useful as an AC motor controller, especially for a Stirling cryocooler.

BACKGROUND ART

Pulse width modulation (PWM) is a widely used technique in applications of power electronics where energy efficiency is important, such as DC power supplies and AC motor control. PWM circuits use power semiconductors as switches that are either on or off. When on, there is only a small voltage across the switch and therefore little power loss in it. When off, there is practically no current through the switch, hence almost no power loss in it. Thus, the switching process wastes little power.

A switching DC power supply is perhaps the simplest illustration of PWM. In such a supply, a load may be alternately switched between a source of unregulated DC voltage and ground. If the time during which the load is connected to the unregulated supply is equal to the time during which it is connected to ground, the average load voltage is equal to one-half of the unregulated voltage. If the time of connection of load to an unregulated supply exceeds the time of connection of the load to ground, average load voltage will exceed one-half the unregulated supply voltage, and conversely. If switching is done at a high frequency, the average voltage can be made to appear across the load by use of compact and simple filters which remove components of the load voltage at the switching frequency and its harmonics. A typical switching frequency is in the range 10–100 khz. From the foregoing, it may be seen that controlling the relative durations of switching to the unregulated supply and switching to ground is a means of controlling the average (or DC) load voltage.

In switching supplies, DC load voltage is usually sensed and compared with a required voltage. If there is any difference, the circuit acts to adjust the switching times in whatever direction will reduce that difference. Usually, in switching supplies and other applications of PWM, the total duration of the switching cycle (in the DC switching supply example, the sum of the time when the load is connected to the unregulated supply and the time when the load is connected to ground) is constant and the duty cycle, that is, the fraction or percentage of the total switching cycle time when a particular switch is closed, is varied.

A DC switching supply is relatively simple in that it produces a constant output voltage. It is, however, possible to use PWM to generate time varying output voltage merely by causing the switching duty cycle to vary with time, provided that the highest frequency at which the duty cycle is varied is low compared to the switching frequency so that output filtering can delete voltages at the switching frequency at its harmonics, leaving a time varying output voltage with the same waveform as that of the duty cycle variation. The identity of the duty cycle variation waveform with the output waveform is an important practical property of PWM, and follows from the linear relationship between duty cycle and average load voltage.

A DC switching supply is relatively simple in another way because its output is unipolar, i.e. either always positive or always negative. For other PWM applications such as AC motor control, a bipolar output voltage having no DC component is needed, and is usually obtained using a bridge circuit that alternately reverses the connection of the load to a DC supply, that is, during part of the switching cycle, one of the two load terminals is connected to the positive end of the DC supply and the other terminal is connected to the negative end, and during the rest of the switching cycle the connections are reversed. With such an arrangement, output voltage is zero if the duty cycle is 50%, and output voltage changes in polarity as the duty cycle varies from below 50% to above 50%.

For AC motor control, a sinusoidal output from a PWM controller is advantageous compared to other waveforms such as a square wave (see, for example, U.S. Pat. No. 5,165,005) because harmonics in the output waveform waste power in the motor and cause noisy operation as well as possible vibration problems. However, sine wave PWM is more complicated than square wave PWM, because it requires continuous variation of duty cycle above and below a mean value of 50%, while square wave PWM requires only two values of duty cycle, one less than 50% and the other greater. Furthermore, if the sinusoidal output is to have low harmonic content, the waveform of duty cycle variation must be accurately sinusoidal.

The main purpose of the present invention is to address a need for a simple, inexpensive circuit that will generate the switching waveforms required for precise sinusoidal PWM. Such a circuit has many potential applications, such as variable speed induction motor drive and variable amplitude linear motor drive, which applications at present may use square waveforms or relatively complex digital methods for producing sinusoidal waveforms. In some infrequent PWM applications, such as vibration control, duty cycle must vary with time non-sinusoidally. The methods and circuits of the present invention are usable in such application as well as for the special but much more common case of sinusoidal modulation.

BRIEF DISCLOSURE OF INVENTION

The invention is an electrical circuit and method for generating a continuous train of width modulated pulses. A square wave is generated and a time delay circuit provides a delayed analog of the square wave. A controllable duration one-shot multivibrator generates a modulating pulse having a duration proportional to the sum of the absolute value of the modulating signal and a constant offset. The constant offset is chosen so that, in the absence oil a modulating signal, the offset provides the control signal to the one-shot multivibrator which causes an output modulating pulse from the multivibrator to be equal in duration to the time delay. The time delay is chosen to exceed the minimum duration pulse which the multivibrator intrinsically is capable of obtaining. The polarity of the modulating signal is detected, a logical OR operation is performed upon the delayed square wave and the modulating pulse and an EXCLUSIVE OR operation is performed upon the combination of the result of the OR operation and the polarity detector logic level output.

BRIEF DESCRIPTION OF DRAWINGS

FIGS. 1b through 1g are diagrams of voltage waveforms at six nodes of FIG. 1a.

FIG. 2a is a block diagram that elaborates on FIG. 1a in order to illustrate other basic concepts of the invention.

FIGS. 2b through 2h are diagrams of voltage waveforms at six nodes of FIG. 2a.

Figure 1A:
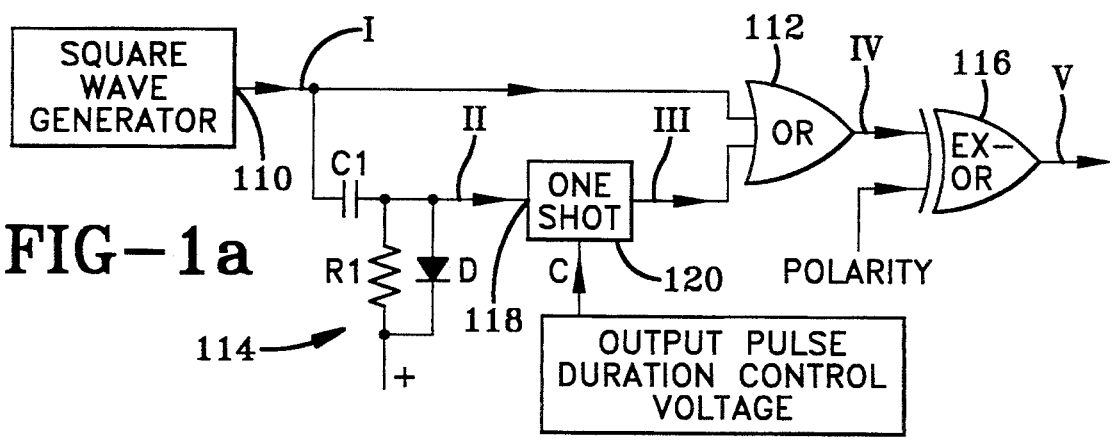
FIG. 1a is a block diagram illustrating some of the basic concepts of the invention.

In describing the preferred embodiment of the invention which is illustrated in the drawings, specific terminology will be resorted to for the sake of clarity. However, it is not intended that the invention be limited to the specific terms so selected and it is to be understood that each specific term includes all technical equivalents which operate in a similar manner to accomplish a similar purpose. For example, the word connected or terms similar thereto are often used. They are not limited to direct connection but include connection through other circuit elements where such connection is recognized as being equivalent by those skilled in the art. In addition, many circuits are illustrated which are of a type which perform well known operations on electronic signals. Those skilled in the art will recognize that there are many, and in the future may be additional, alternative circuits which are recognized as equivalent because they provide the same operations on the signals. Further, those skilled in the art will recognize that, under well known principles of Boolean logic, logic levels and logic functions may be inverted to obtain identical or equivalent results.

DETAILED DESCRIPTION

The present invention is a pulse width modulator that processes a modulating voltage signal that is a continuous function of time (which will be denoted by t), and which may take on both positive and negative values as time progresses. The modulating voltage will be denoted by the functional notation $V_m(t)$. What is required of a pulse width modulator, and what the invention generates, is a succession of voltage pulses, all of constant duration (denoted by T), each pulse being divided into two time intervals, during one of which the pulse voltage is zero (referred to as "low" level), and during the other of which the pulse voltage is a positive value that is the same for all pulses. The positive pulse voltage will be referred to as the "high" level. The invention uses logic circuits for which the high level is a logic "1" and the low level is a logic "0". The output of the invention is a pulse train, with each pulse starting at the end of the pulse that preceded it. Linear PWM requires, and the invention generates, a pulse train with these properties;

a) a pulse beginning at an instant when $V_m(t)$ is zero, having equal duration of high and low levels;

b) a pulse beginning at a time when $V_m(t)$ is positive, having a high level duration exceeding T/2 by a time interval that is proportional to $V_m(t)$ at the start of the pulse; and c) a pulse, beginning at a time when $V_m(t)$ is negative, having a high level duration that is less than T/2 by a time interval that is proportional to the absolute value of $V_m(t)$ at the start of the pulse.

If the preceding requirements are met, and the resulting PWM signal is applied to the control elements of the power semiconductors that comprise a standard bridge circuit, the resulting voltage across the load that is connected to the bridge will, after filtering, be a scaled replica of $V_m(t)$, provided that 1/T (the pulse repetition frequency), is very high compared to the highest frequency present in a Fourier decomposition of $V_m(t)$, which is always the case in practice.

The properties of the PWM signal generated by the invention can be summarized by the algebraic formulas:

$$T(high) = (T/2) + \alpha V_m(t) \qquad \text{(Eq. 1)}$$

or, alternatively (dividing by T)

$$duty\ cycle = 0.5 + \alpha V_m(t)/T, \qquad \text{(Eq. 2)}$$

where duty cycle = T (high)/T

In the first formula, T (high) represents the high level interval of a particular pulse and $V_m(t)$ is the modulation voltage at the start of the pulse. $\alpha$ is a number that determines how much $V_m(t)$ changes T (high). If $\alpha = 0$, there is no modulation and the entire pulse train has equal high and low times. The product $\alpha |V_m(t)|$ must not exceed T/2 or overmodulation will result, that is, a high or low level will exist during the entire pulse and there will be a loss of proportionality between T (high) and $V_m(t)$.

It should be Noted that practical PWH generators, including the invention, depart very slightly from the above formula because $V_m(t)$ generally changes during the pulse time T. However, this error is very small when (1/T) is high compared to the highest frequency present in $V_m(t)$, and will be disregarded here.

In the following description and claims several parameters are mathematically defined. They are reproduced and defined here in a table to facilitate reference to them.

TABLE 1

$\alpha$ = a gain coefficient with dimensions of seconds/volt

C(t) = the control input signal to the monstable ("one-shot") multivibrator which controls the duration of its output pulse.

I(t) = the square wave input which is output from the square wave generator

M(t) = the modulating pulse output from the multivibrator n = the number of a pulse where the pulses are numbered in sequence from 1 to the n th pulse.

T = the period of the square wave I(t).

t = time t (min) = the minimum output pulse duration which a practical one-shot is capable of generating $t_o$ = the duration of the one-shot output $\tau$ = duration of the time delay circuit (should be greater than $t_o$)

T(high) = the time duration a pulse width modulated output pulse is at a high level T(low)=the time a pulse width modulated output pulse is at a low level, such as off V(critical)=the greatest one-shot input control voltage which gives a one-shot output pulse of duration t(min)

$V_m(t)$=the modulating voltage

V(offset)=an adjustable dc voltage which is summed with $V_m(t)$ (should be adjusted to $\tau = \alpha$V(offset))

FIG. 1a is a block diagram of a configuration that embodies some of the fundamental ideas of the invention. The circuit of FIG. 1a begins with a 50% duty cycle square wave (equal high level and low level durations) applied by a square wave generator 108 at its output 110. By means of an OR logical operation 112, the circuit adds to the square wave a variable duration pulse, which is generated by the lower circuit branch 114, that rises from low level to high level at the negative transition of the square wave. The result is a square wave that is high for 50% or more of the entire cycle time. To accommodate duty cycles less than 50% required for bipolar PWM, FIG. 1a includes a final EX-clusive-OR operation 116 with one input being the OR output and the other a "Polarity" signal that can be either high or low. From the definition of the EX-OR operation, if Polarity is low, the EX-OR output is the same as the OR output, and if Polarity is high, the EX-OR output is the complement of OR output, i.e., EX-OR output is high when OR output is low and conversely. The inclusion of the EX-OR operation therefore makes it possible for this configuration to produce outputs with duty cycles greater or less than 50%.

Figure 1B:
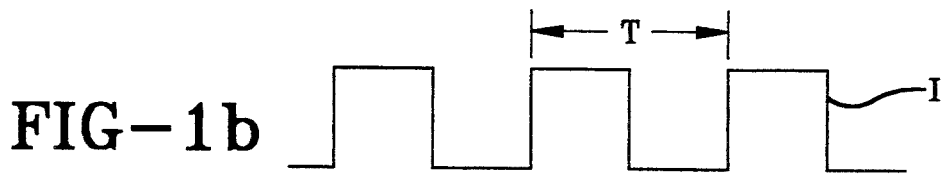

FIG. 1b shows the 50% duty cycle input square wave, which is labelled I, and has period T.

Figure 1C:
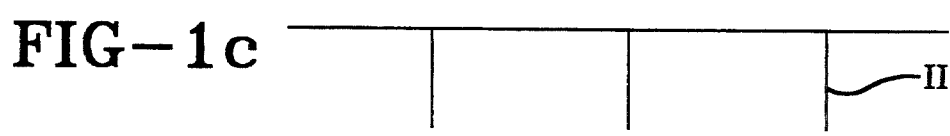

The circuit in FIG. 1a consisting of resistor R1, capacitor C1, is a differentiator circuit with diode D shorting out the positive output so that the three element circuit generates negative pulses at the negative transitions of I. These pulses are illustrated by FIG. 1c and are labelled II.

Figure 1D:
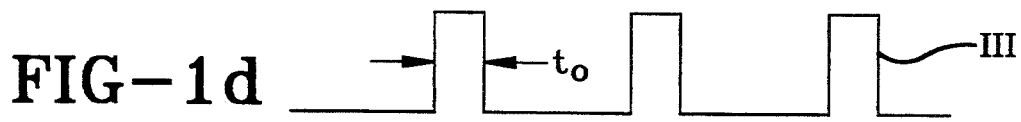
Figure 1E:
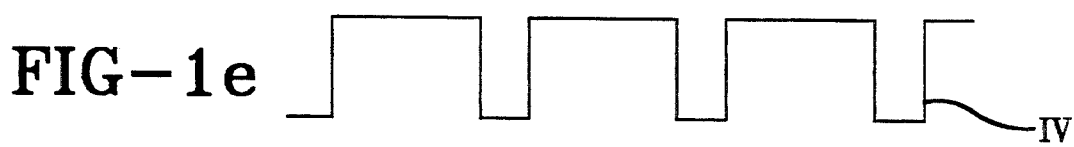
Figure 1F:
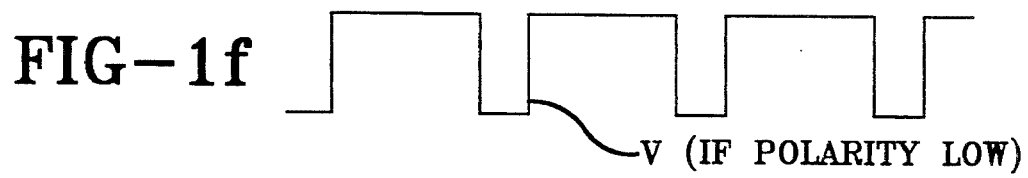
Figure 1G:
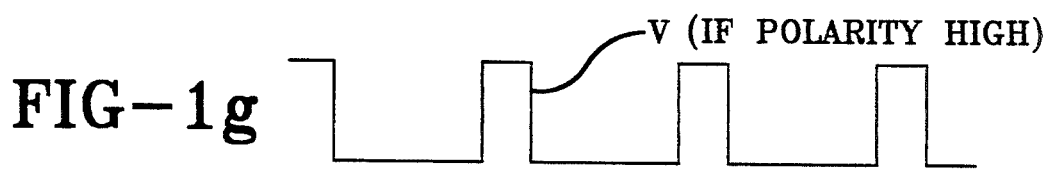

As shown in FIG. 1a, the negative pulses II are applied to the trigger input 118 of a controllable duration one shot multivibrator 120 (also known in the art as a variable one shot), and initiate a modulating pulse at the one-shot output. This one shot output pulse labelled III, has duration $t_o$ as shown in FIG. 1d. Duration $t_o$ is proportional to a control voltage applied to control terminal C of the one-shot 120. FIG. 1e shows waveform IV, which is the result of the logic operation (III OR I) of OR gate 112 and is a square wave with a duty cycle greater than or equal to 50%. FIGS. 1f and 1g show waveform V, which is the result of the logic operation (IV EX-OR Polarity) of EXCLUSIVE OR gate 116, in the respective cases Polarity low (V and IV identical) and Polarity high (V the complement of IV).

An actual circuit constructed in accordance with FIG. 1a would encounter a serious practical difficulty because controllable one-shot multivibrators generally have a minimum output pulse duration (due to storage effects) which will be designated here as t(min). If the voltage at control terminal C is reduced below a critical value V(critical) which produces output pulse duration t(min), the output pulse duration will no longer be controlled by voltage at C. As a consequence, operation of a PWM circuit according to FIG. 1a will be uncontrolled whenever the signal at C is less than the critical value. In the case of sinusoidal PWM, this would occur in a time interval near each zero crossing of an input sinusoid intended to modulate the duty cycle. The resulting "crossover distortion" would be generally undesirable.

FIG. 2a is a block diagram of a circuit that augments the circuit of FIG. 1a in order to eliminate crossover distortion caused by the existence of a minimum controllable value of one-shot output pulse duration. Instead of applying square wave input I directly to an OR gate as in FIG. 1a, square wave I is, before application to the OR gate, delayed in time by an interval $\tau$ at time delay circuit 22 that exceeds t(min). As in FIG. 1a, the one-shot is triggered by the negative transition of square wave I. From the nature of the OR operation, it then follows that the duty cycle at the OR output is 50% for all values of $t_o$, the one-shot output pulse duration, less than or equal to $\tau$.

By time shifting the square wave I to a later time by the time delay circuit 22, an output pulse III from one-shot 120 and of duration $t_o$ occurs when the input to OR gate 112 is still high and therefore does not affect the output IV of OR gate 112. If $t_o > \tau$ the duty cycle at the OR output varies linearly with $(t_o - \tau)$.

However, for linear PWM, what is required is that the duty cycle vary linearly with the modulating signal. This requirement is met in the invention by summing the modulating voltage, designated $V_m(t)$, where t represents time, with an adjustable DC offset voltage $V_{offset}$. Then, if $\alpha$ is a number that when multiplied by the voltage at control terminal C gives output pulse duration, it follows that, if $t_o > \tau$, $$\text{duty cycle} = 0.5 + [\alpha(V_m(t) + V_{offset}) - \tau]/T \qquad (Eq. 3)$$

In practice, $V_{offset}$ is to be adjusted so that $\alpha V_{offset} = \tau$. It then follows that with such adjustment, $$\text{duty cycle} = 0.5 + \alpha V_m(t)/T, \qquad (Eq. 4)$$

which is exactly what is needed for linear duty cycle modulation by $V_m(t)$. Further, since $V_m(t)$ is assumed positive for the circuit of FIG. 2a (in later paragraphs of the specification, bipolar $V_m(t)$ will be dealt with) and $\tau > t(min)$, the one-shot control voltage at terminal C is always greater than that which produces output pulse duration t(min), hence there is no crossover distortion.

FIG. 2b illustrates the 50% duty cycle square wave, again labelled I to be consistent with FIG. 1a.

FIG. 2c shows waveform I delayed by time T. The delayed waveform is labelled I'.

FIG. 2d shows negative going trigger pulses simultaneous with the negative transitions of signal I (not of I'). These pulses are labelled II, again consistent with FIG. 1a.

In FIG. 2a, the circuit block 224 labelled SUM adds an adjustable DC offset voltage to the modulating signal $V_m(t)$ that is assumed to always have a positive polarity. The SUM circuit output 226 is applied to the control terminal C of a one-shot. FIG. 2e shows the one-shot output pulse (labelled III) when $V_m(t) = 0$ and when $V_{offset}$ is adjusted so that $\alpha V_{offset} = \tau$ as described above. It may be seen from FIG. 2e that the transitions of both signal I' and signal III from high to low are simultaneous. It then follows from the nature of the OR operation that OR gate output (labelled IV) is identical to I', as shown in FIG. 2f. In other words, if $V_m(t) = 0$, output of the OR gate is a 50% duty cycle square wave as required for linear PWM. Therefore the "crossover distortion" for $0 \leq V_m(t) < V(\text{critical})$ which was described in connection with the circuit of FIG. 1a is eliminated.

FIGS. 2g and 2h respectively show one-shot output and OR gate output for $V_m(t)>0$, in which case $t_o>\tau$ and OR gate output is a square wave with duty cycle greater than 50%.

FIG. 2a shows an EXclusive-OR gate whose function is the same as that described in connection with FIG. 1a, that is, to produce duty cycles less than 50% if the Polarity input to the EX-OR gate is high, and duty cycles greater than 50% if the Polarity input is low.

The configuration of FIG. 2a will accept only positive modulation signals $V_m(t)$ while a practical modulator must accept bipolar modulation signals and generate duty cycles greater than 50% for one modulation polarity and duty cycles less than 50% for the other modulation polarity.

FIG. 3 is a block diagram of the invention and illustrates such a practical circuit. It shows an augmentation of the configuration of FIG. 2a by two more functional elements. The first of these is a full wave rectifier 328 whose input is bipolar $V_m(t)$ and whose output is $|V_m(t)|$, i.e. the absolute value of $V_m(t)$, which is always positive. The second element is a polarity signal generator 330 which transitions between high and low levels when $V_m(t)$ changes polarity. As shown in FIG. 3a, the sum of $|V_m(t)|$ and offset voltage $V_{offset}$ is applied to the pulse duration control terminal C of a one-shot multivibrator 320, as in FIG. 2a. In practice, $V_{offset}$ is adjusted so that $\alpha V_{offset}$ is equal to the time $\tau$ by which input square wave I is delayed, as explained previously in connection with FIG. 2a. The polarity generator 330 output is applied to one input of the EX-OR gate 316 in order to change duty cycle excursions at V, the EX-OR output, from less than to greater than 50% when $V_m(t)$ changes polarity. Waveforms I, I', II, III and IV for FIG. 3a are the same as those illustrated by FIGS. 2b through 2h respectively. FIG. 3b shows $V_m(t)$ as a sinusoidal function of time, although the invention is not restricted to sinusoidal $V_m(t)$. FIG. 3c shows $|V_m(t)|$, which is the output of the full-wave rectifier 328 shown in FIG. 3a. FIG. 3d illustrates the Polarity signal, which in this example changes from low to high when $V_m(t)$ changes from positive to negative. FIG. 3e shows waveform V, the final PWM signal at the output of the EX-OR gate. FIG. 3e must be regarded as illustrative only, since in practice there would be hundreds of pulses per modulation cycle rather than the small number shown in the figure. Noteworthy in FIG. 3e are:

a) 50% duty cycle at the zero crossings of $V_m(t)$;
b) duty cycles greater than 50% for the first half cycle of $V_m(t)$ and less than 50% for the second half cycle; and
c) generally, a different duty cycle for each successive pulse, with duty cycle increasing and then decreasing during the first half cycle.

Therefore, the invention, as described in connection with FIGS. 1-3 can be summarized as follows.

In FIG. 1, the quantity of deviation of duty cycle from 50% is equal to the duration $t_o$ of the one-shot output pulse, which in turn is a function of the modulation amplitude $V_m(t)$, except for $$-V_{(critical)} \leq V_m(t) \leq V_{(critical)}$$

where crossover distortion occurs. The direction (i.e., more or less than 50% duty cycle) of that deviation is determined by the detected polarity of $V_m(t)$.

In FIG. 2, the combination of the time shift $\tau$ by at least t(min) combined with summing $V_m(t)$ with an offset voltage $V_{(offset)}$, chosen so $\tau = \alpha V_{(offset)}$, together get rid of the crossover distortion for positive values of $V_m(t)$, but the circuit of FIG. 2 won't accept negative values of $V_m(t)$. The offset voltage $V_{(offset)}$ causes the quantity of deviation of the duty cycle from 50% to be determined, not by the total duration of the one-shot output (as in FIG. 1), but rather by the time the one-shot output duration exceeds the time delay $\tau$ which is also the duration an output pulse from the one-shot would have for a control input voltage to the one-shot of only $V_{(offset)}$.

In FIG. 3, the further insertion of a full wave rectifier, so that $|V_m(t)|$ instead of $V_m(t)$ is applied to the summing circuit, allows also acceptance of negative values of $V_m(t)$.

Figure 3A:
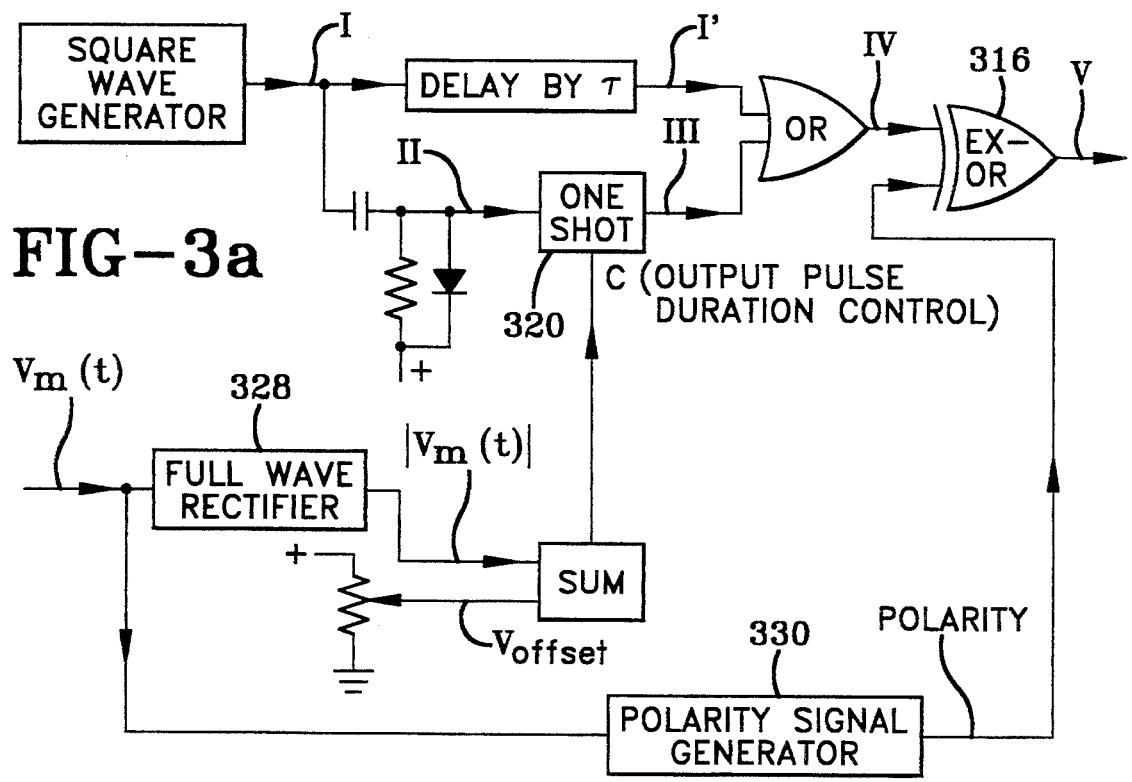
FIG. 3a is a block diagram of the invention.
Figure 3B:
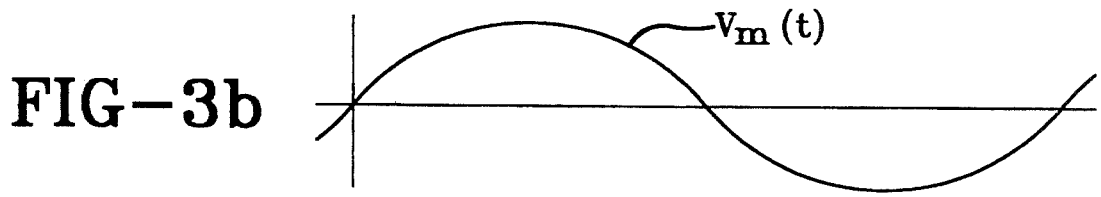
FIGS. 3b through 3e are diagrams of those four waveforms, at nodes of FIG. 3a, that do not appear in FIG. 2b through 2h.
Figure 3C:
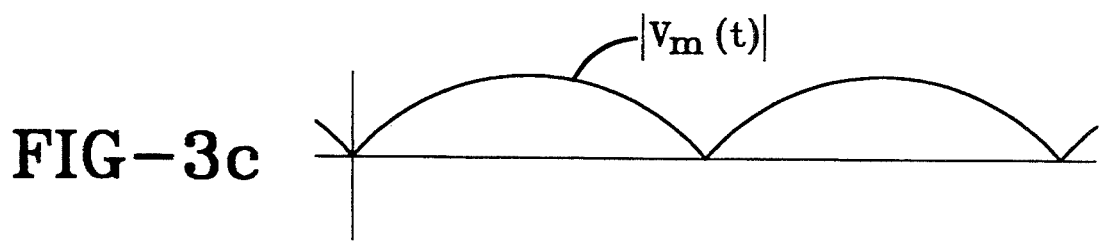
Figure 3D:
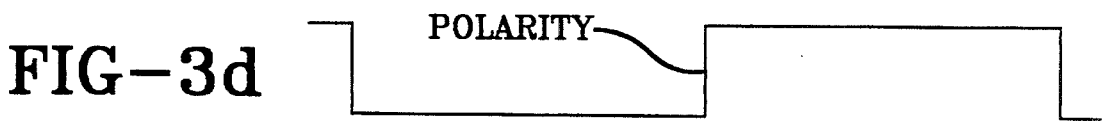
Figure 3E:
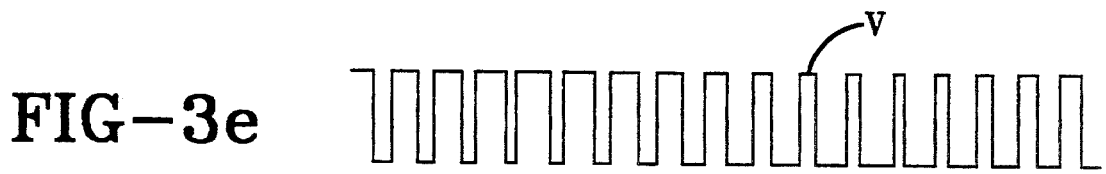
Figure 4:
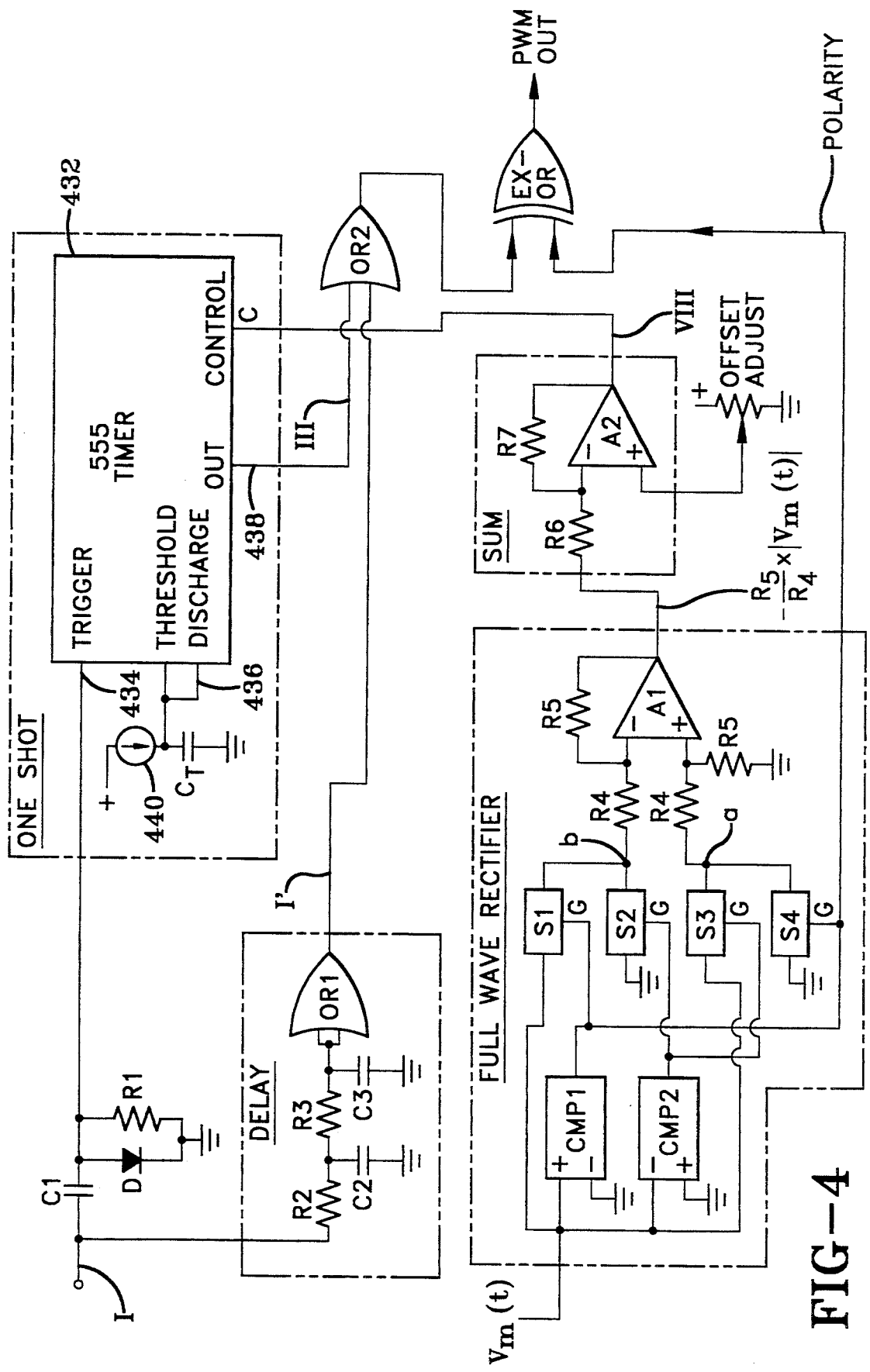
FIG. 4 is a schematic diagram of a preferred embodiment of the invention.

FIG. 4 shows a schematic circuit diagram of a preferred embodiment of the invention, with the functional blocks corresponding to those shown in FIG. 3a enclosed by dashed lines (except for the Polarity signal generator, since in this embodiment Polarity signal is conventionally taken from one of the nodes of the full-wave rectifier rather than providing a duplicate comparator to separately generate the Polarity signal). For a variable one-shot this embodiment uses an inexpensive timing circuit 432 that is available from many vendors and is labelled "555 Timer". The timer 432 is shown in FIG. 4 configured as a variable one-shot. Prior to receiving a negative pulse at its "trigger" terminal 434, the internal circuitry of the 555 places a short circuit from the "discharge" terminal 436 to ground and sets the "out" terminal at a low level. A negative trigger pulse removes the short circuit and places the output 438 at a high level. With the short circuit removed, timing capacitor $C_T$ is charged by the current source 440 until timing capacitor $C_T$ reaches the voltage at the "threshold" terminal, which in this configuration is the same voltage as that placed on control terminal "C". When the threshold voltage is reached, the internal circuitry of the 555 restores the short from the "discharge" terminal to ground and pulls the output 438 low. Since the rate of change of voltage across timing capacitor $C_T$ is constant when it is being charged by a current source:, and since it starts charging with no voltage across it, the time required to charge $C_T$ to threshold voltage is directly proportional to the threshold voltage, hence directly proportional to control voltage in this configuration. It follows that the time when the 555 output is high is directly proportional to control voltage at "C", which is what is necessary for liner PWM (duty cycle varying linearly with $V_m(t)$.

The 555 timer has a minimum controllable one-shot pulse duration t(min) of, typically, 10 microseconds. Therefore, without the delay and offset technique described earlier in connection with FIGS. 2 and 3, a PWM circuit using the 555 as a one-shot, as in FIG. 1a, would not function acceptably, since crossover distortion would occur over a large fraction of a sinusoidal cycle of $V_m(t)$, for typical pulse duration T of about 50 microseconds. As shown in FIG. 4, waveform I (a 50% duty cycle square wave) is delayed by means of R2, C2, R3, C3 and the OR gate labelled OR 1. With both inputs to OR 1 connected together as shown, the output of OR 1 (labelled I', consistent with FIGS. 2a and 3a) transitions high when the voltage at its common input is increasing and reaches about 60% of high level, and transitions downward when the common input is decreasing and reaches about 30% of high level. Both transition values of input voltage are delayed by practically the same time interval from the zero crossings of signal I, hence signal I' is also a 50% duty cycle square wave, with its transitions delayed from those of I by a time interval $\tau$ which is made to exceed t(min) by proper choice of R2, C2, R3, and C3.

Theoretically time delay $\tau$ can desirably equal t(min). However, t(min) varies among different 555 Timer integrated circuits and also varies as a function of temperature. Consequently, time delay $\tau$ should be chosen to provide an acceptable safety margin to assure that it is at least as great as t(min) for all variations of 555 Timer circuits under all operating conditions. Also, time delay should not exceed T/2 or it will encroach upon preceding pulses.

$V_m(t)$ is full wave rectified by a difference amplifier consisting of R4, R5 (two of each) and operational amplifier A1, used in combination with comparators CMP 1 qnd CMP 2 and bilateral switches S1 through S4. When $V_m(t)$ is positive, CMP 1's output, which is applied to gate terminals G of switch S1 and switch S4 goes high and causes those two switches to close. S2 and S3 are open when $V_m(t)$ is positive because CMP 2's output, which is connected to the gates of S2 and S3, is low. Therefore the voltage at node b is $V_m(t)$ and the voltage at node a is zero when $V_m(t)$ is positive. When $V_m(t)$ is negative, S2 and S3 are closed, S1 and S4 are open, the voltage at node b is zero, and the voltage at node a is $V_m(t)$. Since $$\text{output of } A1 = (\text{voltage at node a} - \text{voltage at node } b) \times \frac{R5}{R4},$$

it follows that the output of A1 is equal to $(R5/R4) \times (-|V_m(t)|)$. An inversion of the sign of A1's output takes place when it is summed with a positive offset voltage by A2, R6, and R7, so that waveform VIII, which is applied to control terminal C of the 555 timer, is always positive, as required for control of the 555 in its configuration as a variable one-shot.

In FIG. 4, Polarity signal is obtained from the output of comparator CMP 1, which transitions between high and low levels at the zero crossings of $V_m(t)$, and hence has all of the properties required of the Polarity signal. The output of comparator CMP 2 could have been used as Polarity signal, in which case PWM output would be complemented (high level would become low level and vice versa) relative to PWM output with CMP 1's output as the Polarity signal. Each comparator is a conventional comparator having a high gain differential amplifier and two differential inputs connected to compare the signal $V_m(t)$ to ground.

Figure 5:
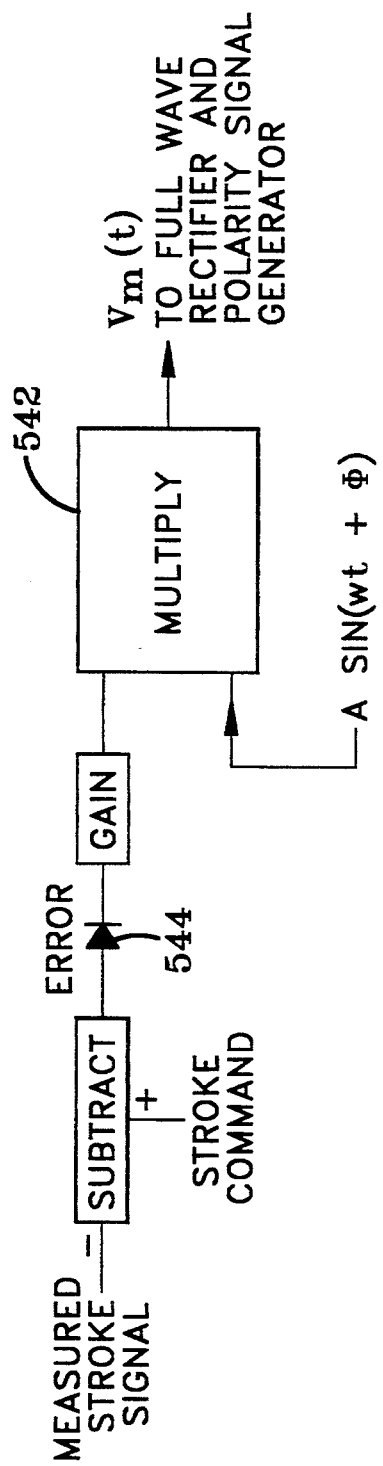
FIG. 5 is a block diagram showing how the basic invention can be augmented for closed loop control of a linear motion electric motor.

FIG. 5 shows preprocessing of $V_m(t)$ that adapts the invention to closed loop control of the stroke of a linear motor. For this application, the most efficient form for $V_m(t)$ is sinusoidal, and the purpose of closed-loop control is to accomplish automatic adjustment of the motor stroke to a preset value. Since stroke varies linearly with applied voltage to the motor, stroke adjustment can be accomplished by changing the amplitude of a sinusoidal waveform $V_m(t)$. In FIG. 5, one input to a multiplier 542 is a constant amplitude sinusoidal voltage, shown in the figure to have amplitude A and constant phase angle $\Phi$. The other input is an amplified dc error voltage resulting from the operation gain $\times$ (stroke command dc voltage $-$ measured stroke dc voltage). If the measured stroke falls below the stroke implicit in the command signal, motor voltage is increased and if gain is high, the error will be driven to a low value. The diode 544 in FIG. 5 prevents negative errors which would otherwise occur when measured stroke exceeded command stroke, and which would cause the loop to become unstable because, as stroke rose increasingly above the command stroke, the amplitude of $V_m$ would be further increased. In the event measured stroke does exceed command stroke, the error voltage is zero and therefore the drive voltage applied to the linear motor goes essentially to zero. This turning off of the motor permits motor losses (e.g. friction and resistive losses) to cause the stroke amplitude to decay.

The invention differs from prior art in its use of the combination of delay and offset as described to eliminate crossover distortion that would otherwise exist, and its use of a combined OR, EXCLUSIVE OR operation to generate duty cycles greater and less than 50%.

Many variations are possible within the spirit of the invention. For example, logical operations in which high level represents logic "0" and low level logic "1" could be used without any consequential effect on output.

While certain preferred embodiments of the present invention have been disclosed in detail, it is to be understood that various modifications may be adopted without departing from the spirit of the invention or scope of the following claims.

I claim:

1. A pulse width modulation method for generating a succession of periodic pulses having a selected period, each pulse being at a logic high level for a time interval during the period and at a logic low level for the remainder of the period, the duration of said time interval deviating from half the period by a time which is proportional to the amplitude of a modulating signal, said method comprising:

(a) generating a square wave pulse signal at said selected period, the square pulses having equal time intervals at a logic high level and at a logic low level;

(b) generating a delayed analog of the square wave signal delayed by a time delay $\tau$;

(c) generating a modulating pulse beginning at the transition between said equal time intervals of said square wave and having a duration T(high) proportional to the sum of the absolute value of the modulating signal $|V_m(t)|$ and a constant offset V(offset) in accordance with the equation T(high)$=\alpha[|V_m(t)|+V(\text{offset})]$, said constant offset having a value satisfying the equation $\tau=\alpha V(\text{offset})$, $\alpha$ being a proportionality constant having units of time per volt;

(d) performing an OR operation upon the combination of the delayed square wave signal and the modulating pulse;

(e) detecting the polarity of the modulating signal and generating a high logic level in response to one polarity and a low logic level in response to the opposite polarity; and (f) performing an EXCLUSIVE OR operation upon the combination of the result of the OR operation and the polarity detection logic level.

2. A method in accordance with claim 1 wherein the modulating pulse generating step includes full wave rectifying the modulating signal.

3. A method in accordance with claim 1 and further comprising:
 (a) detecting the stroke of a linear motor having an armature winding and generating a signal having a value proportional to the detected stroke;
 (b) detecting the difference between a desired stroke command signal and said detected stroke signal to generate an error signal;
 (c) multiplying a sinusoidal signal by an amplified analog of said error signal to obtain said modulating signal; and
 (d) applying an amplified analog of the result of said EXCLUSIVE OR operation to said armature winding.

4. An electrical circuit for generating a succession of periodic pulses having a selected period, each pulse being at a logic high level for one time interval during the period and at a logic low level for the remainder of the period, the duration of said time interval deviating from half the period by a time which is proportional to the amplitude of a modulating signal, said circuit comprising:
 (a) a square wave generator having square pulses at an output at said selected period, the square pulses having equal time intervals at a logic high level and at a logic low level;
 (b) a controllable duration one-shot multivibrator connected to the square wave generator and triggered at a trigger input by each transition of the square wave generator output from a logic high level to a logic low level, the multivibrator generating at a multivibrator output a modulating pulse having a pulse duration which is proportional to the amplitude of a signal at a control input to the multivibrator, the multivibrator having an intrinsic minimum duration for the modulating pulse;
 (c) a time delay circuit having an input connected to the output of the square wave generator and having a time delay at least as great as said intrinsic minimum duration of the multivibrator;
 (d) a full wave rectifier having an input connected to receive said modulating signal and having an output;
 (e) a summing circuit having an output connected to the control input of the multivibrator, one input connected to the output of the full wave rectifier and having a second input;
 (f) a dc offset signal source having an output connected to the second input of the summing circuit and having an output signal level which, when applied through the summing circuit to the multivibrator simultaneously during a zero amplitude modulating signal, causes the multivibrator to have an output pulse duration substantially equal to said time delay of the time delay circuit;
 (g) a polarity sensing circuit having an input connected to receive said modulating signal and having an output, the polarity sensing circuit having a high logic level output when the modulating signal has one polarity and a low logic level when the modulating signal has the opposite polarity; and
 (h) a logic circuit having an input connected to the output of the time delay circuit, an input connected to the output of the multivibrator and an input connected to the output of the polarity sensing circuit, the logic circuit performing a logical OR operation upon the time delay circuit output and the multivibrator output and the logic circuit performing an EXCLUSIVE OR operation upon the output of the polarity sensing circuit and the result of said OR operation.

5. A circuit in accordance with claim 4 wherein said logic circuit comprises an OR gate having inputs connected respectively to the outputs of said time delay circuit and said multivibrator and having an output, the logic circuitry further including an EXCLUSIVE OR gate having inputs connected respectively to the output of said OR gate and the output of said polarity sensing circuit.

6. A circuit in accordance with claim 4 wherein a cascaded differentiator circuit followed by a shunt diode is interposed between the output of the square wave generator and the multivibrator trigger input, the shunt diode connected with a polarity for shunting pulses generated by transitions of the square wave generator output from a logic low level to a logic high level.

7. A circuit in accordance with claim 4 and further comprising a closed loop control system for a linear motor having an armature winding, the control system comprising:
 (a) a summing junction detecting an error signal proportional to the difference between a signal which is proportional to the stroke of said linear motor and a stroke command input signal;
 (b) a high gain amplifier having an input connected to the output of said summing junction;
 (c) a multiplier circuit connected to the output of the high gain amplifier and a source of a sinusoidal signal and generating a signal at an output which is proportional to the product of said error signal and said sinusoidal signal, the output of said multiplier being connected so provide said modulating signal.

8. An electrical circuit for generating a succession of constant amplitude voltage pulses, each pulse being at a logic high level for a time interval T(high) and at a logic low level for a time interval T(low), all pulses having the same total period T which is equal to the sum of T(high)+T(low), said pulses being consecutively numberable by an integer index n, the time interval T(high) varying with the index n according to the equation $$T(high) = 0.5T + \alpha V_m nT$$

wherein
 $\alpha$ is a proportionality constant having units of seconds per volt
 $V_m(t)$ is a modulating voltage which varies as a function of time t
 $V_m(nT)$ is the value of said voltage at the start of the n th pulse for t=nT
said circuit comprising:
 (a) a square wave source having a time varying output voltage I(t) which is a square wave with a period T and equal time intervals T/2 during one of which it is at a logic high level and the other of which it is at a logic low level;
 (b) a full wave rectifier having an input connected to receive the modulating voltage $V_m(t)$ and an output for generating $|V_m(t)|$ proportional to the absolute value of $V_m(t)$;
 (c) a controllable duration one shot multivibrator circuit having a trigger input connected to said square wave source and triggered at each transition of said output voltage I(t) from a high level to a low level, said multivibrator having a modulating pulse output M(t) changing from a low level to a high level in response to said transition and thereafter remaining at a high level for a time interval T(high) which changes as a function of n in accordance with the equation T(high)=$\alpha$C(nT) where C(t) is a control signal applied to a control input of the multivibrator and C(nT) is the value of C(t) when pulse n of the square wave output I(t) transitions from a high logic level to a low logic level, said multivibrator having an intrinsic minimum value t(min) which T(high) can attain;

(d) a delay circuit having an input connected to the output of the square wave source to receive I(t) and having an output I'(t) which is a replica of I(t) delayed by a time $\tau$ resulting in I'(t)=I(t−$\tau$), the time delay $\tau$ satisfying the inequality $\tau$>t(min);

(e) a summing circuit having inputs connected to the output of said full wave rectifier and to an offset voltage source having an output V(offset), the summing circuit generating an output C(t) in accordance with the equation C(t)=|$V_m$(t)|+V(offset), the output V(offset) being a dc voltage which is adjusted so that it satisfies the equation $\alpha$V(offset)=$\tau$;

(f) a polarity sensing circuit having an input connected to receive the modulating voltage $V_m$(t) and having a POLARITY output which transitions between a low logic level and a high logic level at zero crossings of $V_m$(t); and (g) a logic circuit for which a low logic level is logic "0" and a high logic level is logic "1", the logic circuit performing logic operations to provide a logic circuit output PWM OUT in accordance with the equation PWM OUT={[I'(t) OR M(t)]EXCLUSIVE OR [POLARITY]}.

9. A circuit in accordance with claim 8 wherein said polarity sensing circuit comprises a comparator circuit having a grounded input.

10. A circuit in accordance with claim 8 further comprising a closed loop control circuit for a linear electric motor having an armature winding and having the output PWM OUT of said logic circuit connected to apply PWM OUT to a power transistor circuit for controlling the application of power to said armature winding, said control circuit having an input connected to a stroke command signal, an input connected to a stroke measuring circuit which applies a signal proportional to the measured stroke of the linear motor, and an input connected to a source of a sinusoidal signal Asin($\omega$t+$\Phi$), said control circuit having an output generating said modulating voltage $V_m$(t) in accordance with the equations:

$V_m$(t)=Asin($\omega$t+$\Phi$)[GAIN][ERROR] for [ERROR]>0

$V_m$(t)=0 for [ERROR]<0 wherein
ERROR is the difference between the command signal and the stroke measuring signal
A is an amplitude constant
GAIN is a dimensionless, amplification factor
$\omega$ is the angular frequency of said sinusoidal signal in radians per second and
$\Phi$ is a phase shift of said sinusoidal signal in radians.

* * * * *